United States Patent
Prinz et al.

(10) Patent No.: US 7,341,914 B2
(45) Date of Patent: Mar. 11, 2008

(54) METHOD FOR FORMING A NON-VOLATILE MEMORY AND A PERIPHERAL DEVICE ON A SEMICONDUCTOR SUBSTRATE

(75) Inventors: Erwin J. Prinz, Austin, TX (US); Ko-Min Chang, Austin, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 160 days.

(21) Appl. No.: 11/376,411

(22) Filed: Mar. 15, 2006

(65) Prior Publication Data

US 2007/0218631 A1  Sep. 20, 2007

(51) Int. Cl.
*H01L 21/336* (2006.01)

(52) U.S. Cl. .............. 438/260; 438/258; 438/266; 438/288; 257/E21.679

(58) Field of Classification Search .......... 438/260, 438/288, 367, 610; 257/E21.4, E21.457, 257/E21.615
See application file for complete search history.

(56) References Cited

U.S. PATENT DOCUMENTS

| 5,408,115 | A | 4/1995 | Chang |
| 5,824,584 | A | 10/1998 | Chen et al. |
| 5,969,383 | A | 10/1999 | Chang et al. |
| 6,816,414 | B1 | 11/2004 | Prinz |
| 6,964,902 | B2 | 11/2005 | Steimle et al. |
| 2002/0190343 | A1* | 12/2002 | Jones et al. ............ 257/500 |
| 2005/0176202 | A1 | 8/2005 | Hisamoto et al. |
| 2006/0189079 | A1* | 8/2006 | Merchant et al. ...... 438/260 |

* cited by examiner

*Primary Examiner*—Michael Lebentritt
*Assistant Examiner*—Cheung Lee
(74) *Attorney, Agent, or Firm*—Kim-Marie Vo

(57) ABSTRACT

A method for forming a semiconductor device includes forming a first gate electrode over a semiconductor substrate, wherein the first gate electrode comprises silicon and forming a second gate electrode over the semiconductor substrate and adjacent the first gate electrode, wherein the second gate electrode comprises silicon. Nanoclusters are present in the first gate electrode. A peripheral transistor area is formed devoid of nanoclusters.

20 Claims, 5 Drawing Sheets

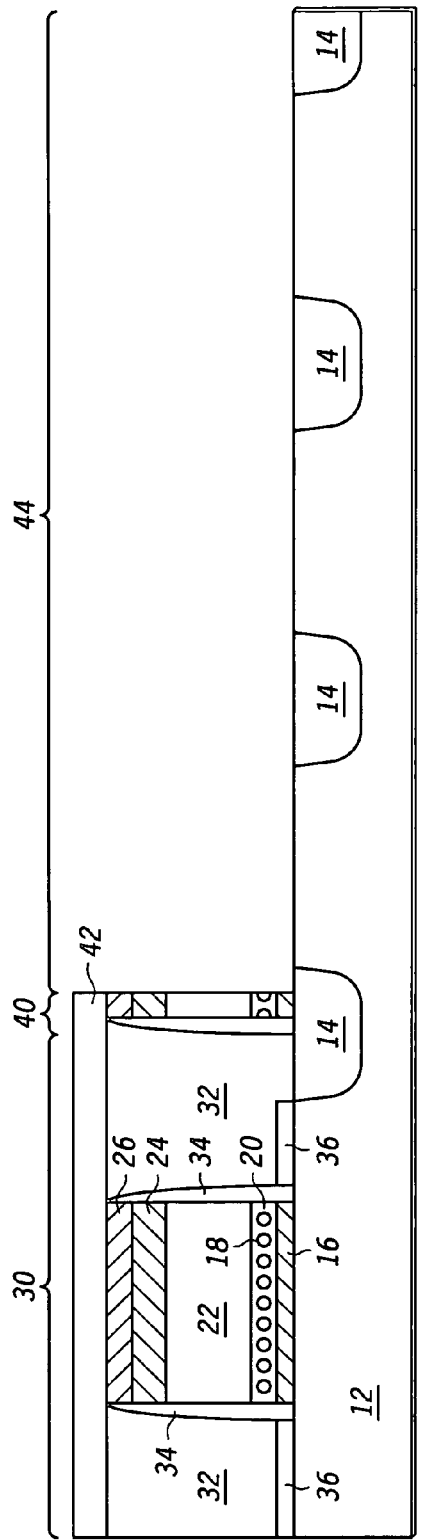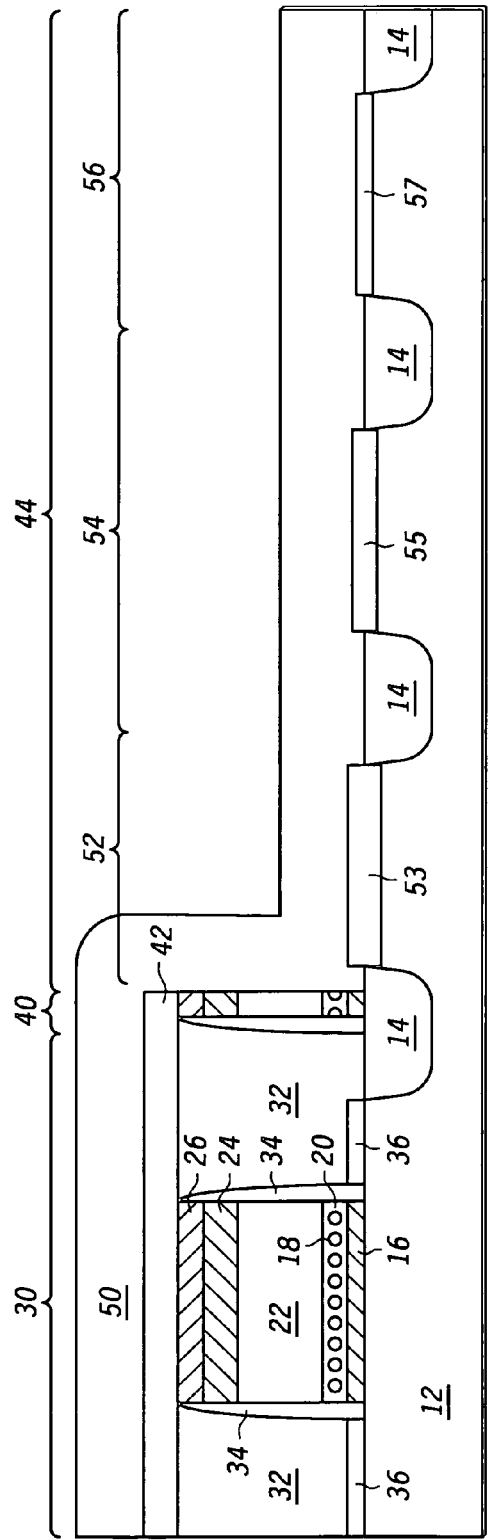

US 7,341,914 B2

METHOD FOR FORMING A NON-VOLATILE MEMORY AND A PERIPHERAL DEVICE ON A SEMICONDUCTOR SUBSTRATE

FIELD OF THE INVENTION

This invention relates generally to semiconductor devices, and more specifically, to integrating a non-volatile memory (NVM) device and a peripheral device on a semiconductor substrate.

BACKGROUND

Some devices such as memories (e.g. non volatile memories) utilize discrete charge storage elements called nanoclusters (e.g. of silicon, aluminum, gold, or germanium) for storing charge in a charge storage location of a transistor. In some examples, the nanoclusters are located between two dielectric layers, a bottom dielectric and a control dielectric. Examples of such transistors include thin film storage transistors. A memory typically includes an array of such transistors. Examples of nanocluster types include doped and undoped semiconductor nanoclusters such as silicon nanoclusters, germanium nanoclusters and their alloys. Other examples of nanocluster types include various conductive structures such as metal nanoclusters (e.g., gold nanoclusters and aluminum nanoclusters), and metal alloy nanoclusters. In some examples, nanoclusters are from 10-100 Angstroms in size.

Some memories that have charge storage transistors with nanoclusters are implemented into integrated circuits that also include peripheral devices, such as low voltage, input/output, and high voltage transistors. Low voltage transistors are used to construct digital logic functions and are optimized for fast switching. They are usually situated in retrograde wells. High voltage transistors are used for charging and discharging the charge storage locations of the charge storage transistors. Charging or discharging the charge storage locations stores or removes one or more bits of information, and may be referred to as programming or erasing. These high voltage transistors typically include a relatively thick gate oxide. When nanocluster-based memories are integrated with transistors having thick gate oxide layers for handling relatively higher voltages and with transistors having thinner gate oxide layers, the severe oxidizing ambient used to make such transistors causes an undesirable increase in the nanocluster-based memory bottom dielectric thickness and causes nanocluster oxidation. Any protection layer that is used to protect a stack including a bottom oxide, nanoclusters, and the control oxide stack may result in damage to the stack when the protection layer is removed. Accordingly, an improved method for integrating a non-volatile device, especially one that utilizes nanoclusters, with peripheral devices, such as a low and high voltage transistors, is needed.

BRIEF DESCRIPTION OF THE DRAWINGS

The present invention is illustrated by way of example and is not limited by the accompanying figures, in which like references indicate similar elements.

FIG. 5 illustrates the workpiece of FIG. 3 after removing portions of a stack of layers from a peripheral area in accordance with an embodiment of the present invention;

FIGS. 6 and 7 illustrate the workpiece of FIG. 4 after performing processes to form gate dielectric layers and gate electrode layers in the peripheral area in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
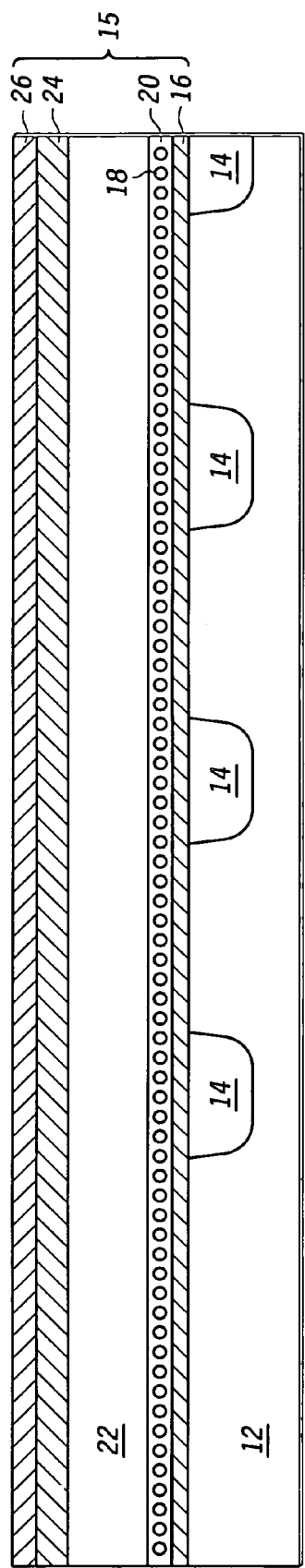
FIGS. 1-4 illustrate cross-sectional views of a portion of a workpiece after performing processes to form at least a portion of a non-volatile device in accordance with an embodiment of the present invention.
Figure 8:
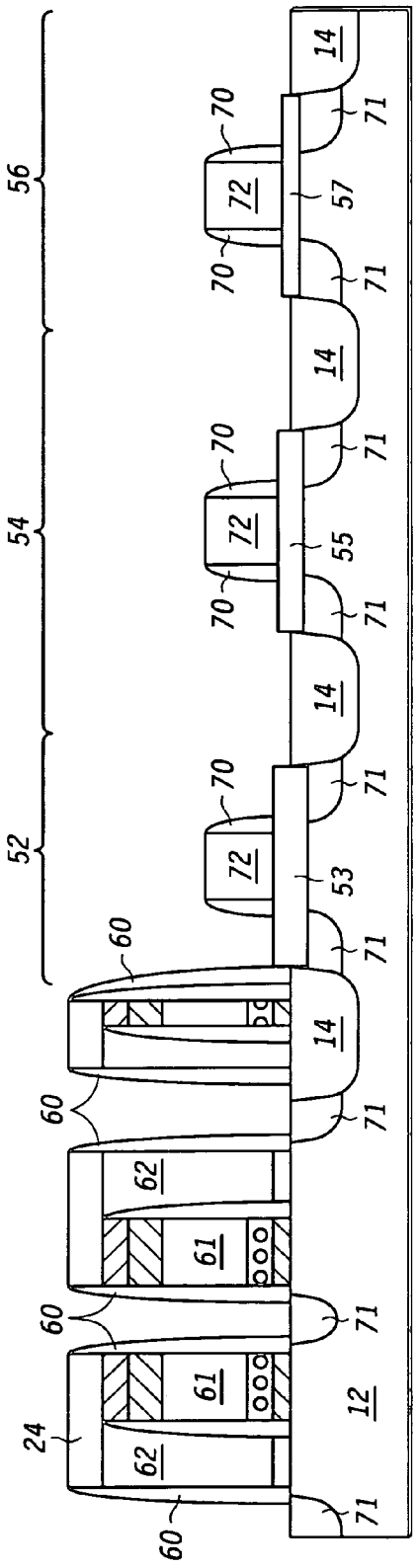
FIGS. 8 and 9 illustrate the workpiece of FIG. 6 after performing processes to form a select gate, a control gate, and peripheral devices in accordance with an embodiment of the present invention.

FIG. 1 illustrates a portion of a workpiece 10 including a semiconductor substrate 12 and a stack 15. The semiconductor substrate 12 can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above. If silicide is to be formed over regions of the semiconductor substrate 12, which in the embodiment shown in FIG. 8 is performed, the semiconductor substrate includes silicon. Isolation regions 14 are formed within the semiconductor substrate 12. In one embodiment, the isolation regions 14 are shallow trench isolation (STI) regions of silicon dioxide and are formed using conventional processing.

The stack 15 includes a first dielectric layer 16, a layer of nanoclusters 18, a second dielectric layer 20, first conductive layer 22, third dielectric layer 24, and a nitride layer 26, which is a layer including nitrogen. The stack 15 forms at least a portion of the NVM device being formed.

The first dielectric layer 16 is a gate dielectric layer 16 formed over the semiconductor substrate 12. In one embodiment, the first dielectric layer 16 is a thermally grown oxide that is approximately 50 Angstroms thick. The first dielectric layer 16 can also be formed by other methods including chemical vapor deposition (CVD) or atomic layer deposition (ALD) and can also be formed from other dielectric materials, such as silicon oxynitride, hafnium oxide, aluminum oxide, the like, or combinations of the above.

The layer of nanoclusters 18 can be formed by island growth during CVD, by aerosol deposition techniques, by spin on coating techniques, by self assembly techniques, such as annealing a thin film to form the nanoclusters, or the like. The nanoclusters 18 may include Si, SiGe, Al, Au, a silicon and germanium alloy, or other types of conductive material or doped or undoped semiconductive materials. In one embodiment, the nanoclusters 18 are formed at densities in the range of $5 \times 10^{11}$ cm$^{-2}$ to $1.1 \times 10^{12}$ cm$^{-2}$ and have an undoped diameter of approximately 50-150 Angstroms or larger with a coverage of the areas they are being formed on (e.g., the entire first dielectric layer 16) of approximately 25% or less. A first conductive layer 22, which in one embodiment includes silicon (e.g., polysilicon) of polysilicon, is formed over the nanoclusters 18.

The second dielectric layer 20, which will serve as the dielectric separating the subsequently deposited nanocrystals or nanoclusters 18 from the control gate and from each other, is formed over the first dielectric layer 16. In one embodiment, the second dielectric layer 20 is deposited oxide, such as SiO$_2$, having a thickness of approximately 80-120 Angstroms.

The first conductive layer 22 may serve as the conductive layer for the control gate portion of the NVM device. In one embodiment, first conductive layer 22 is a layer including silicon, such as a polysilicon layer, approximately 1500 Angstroms thick.

After forming the first conductive layer 22, an third dielectric layer 24 is formed over the conductive layer 22. The third dielectric layer 24, which in one embodiment is an oxide (e.g., $SiO_2$), may be deposited by CVD or thermally grown. In one embodiment, the thickness of the first conductive layer 22 is approximately 700-1000 Angstroms.

A nitride layer 26 is formed over the third dielectric layer 24. The nitride layer 26 may include silicon nitride, silicon oxynitride, silicon rich oxynitride, or the like. The nitride layer 26 may be approximately 700-1000 Angstroms or thicker and formed by conventional processes including CVD. The nitride layer 26 may be used as an etch stop layer (ESL) for subsequent processing steps as discussed later.

Figure 2:
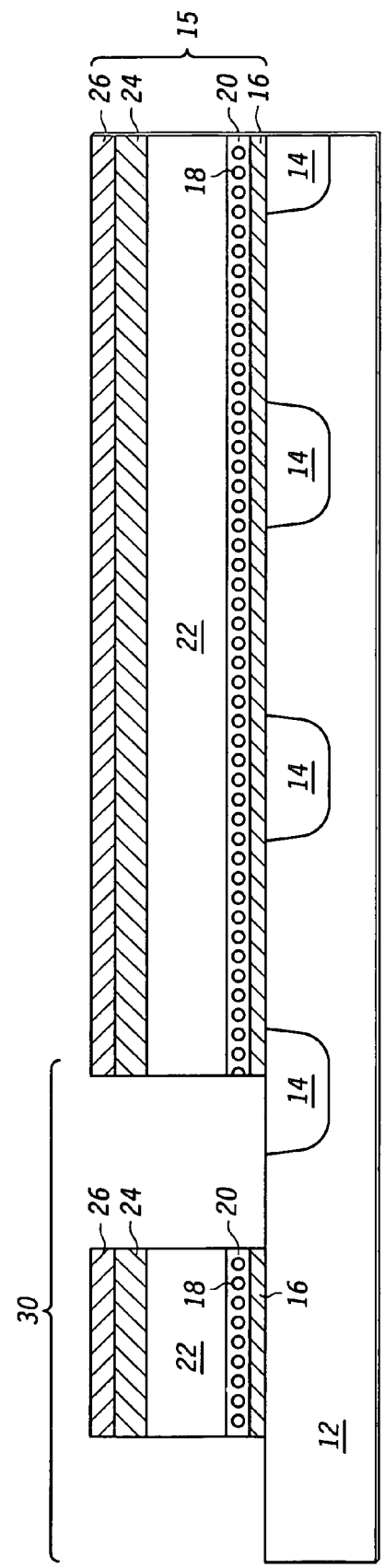

As shown in FIG. 2, the stack 15 is patterned. More specifically, portions of the stack 15 are removed in the NVM region 30. In one embodiment, a dry etch having the chemical species $CF_4$, Ar and $CHF_3$ is used to remove the nitride layer 26, and the third dielectric layer 24. In this embodiment, the conductive layer 22 is removed using a chemistry having the chemical species $Cl_2$, HBr, and $O_2$. Another process may then be used to remove the nanoclusters 18, the dielectric 20, and the gate dielectric 16. This may be done by a dry etch or a combination of dry and wet etch processes. In one embodiment, the dry etch is performed by using a $CF_4$ and Ar chemical species. In another embodiment, an HF (chemistry) is used for the wet etch. In one embodiment, the nanoclusters 18 can be removed areas of the semiconductor substrate 12 that are not under the stack 15 using HF and SC1 megasonic clean.

Figure 3:
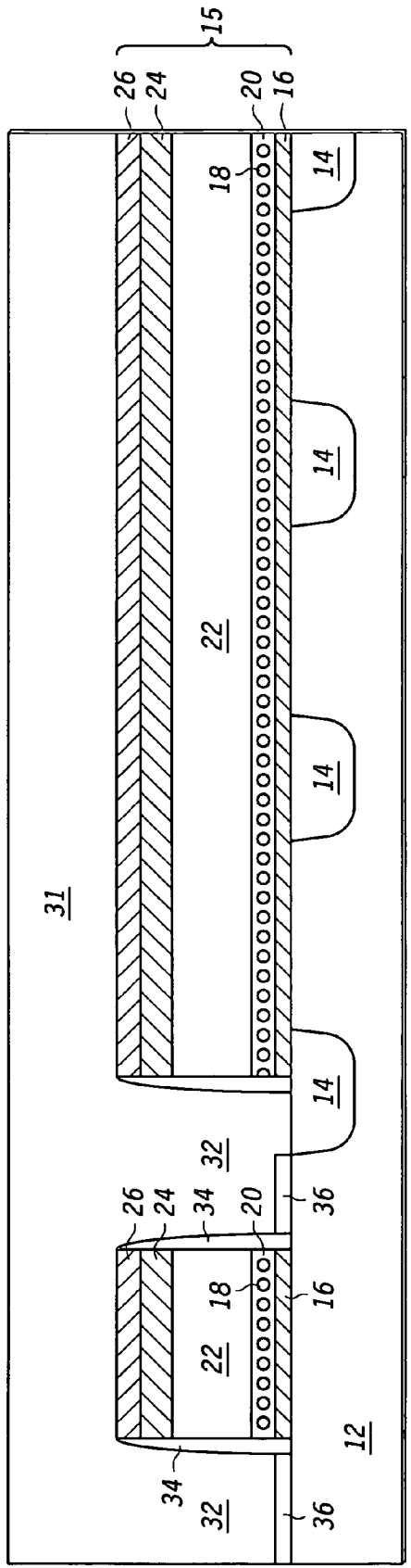

As shown in FIG. 3 after patterning the stack 15, spacers 34, gate dielectric regions 36, and a conductive layer 31 are formed. The spacers 34 may be formed by depositing a dielectric layer, such as an oxide (e.g., $SiO_2$) or oxynitride, and then anisotropically etching the dielectric layer. The spacers 34 are formed on the sidewalls of the stack 15. After forming the spacers 34, the gate dielectric regions 36 are formed. In the embodiment illustrated, the gate dielectric regions 36 are thermally grown. Hence, no gate dielectric region is formed over the exposed isolation regions 14 or any covered regions (e.g., regions covered by the portions of the stack 15.) After forming the gate dielectric regions 36, the conductive layer 31 (e.g., polysilicon) is formed over the workpiece 10. The conductive layer 31 can be formed by any suitable process, such as a deposition (e.g., CVD).

Figure 4:
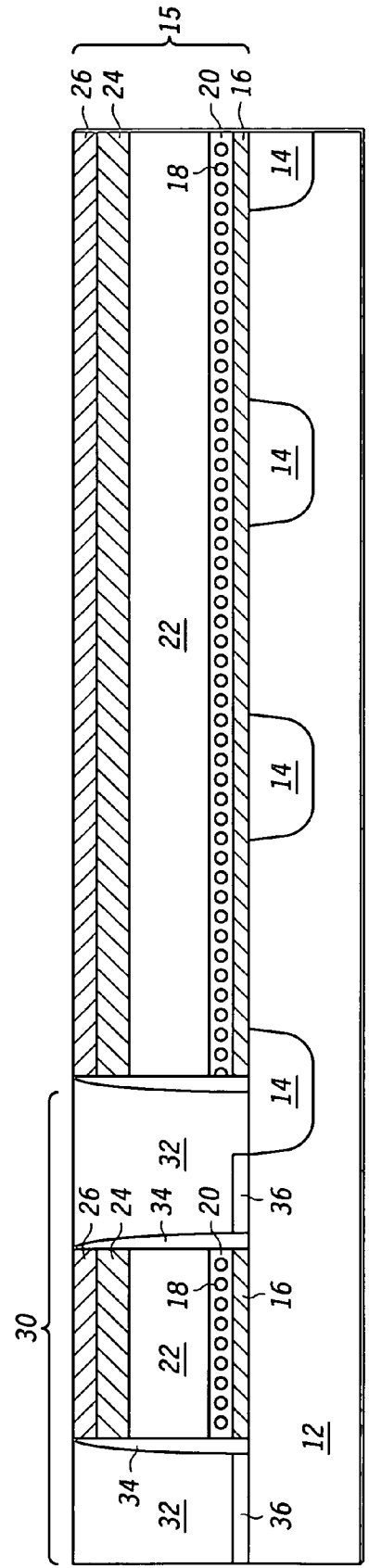

As illustrated in FIG. 4, after forming the conductive layer 31 over the workpiece, portions of the conductive layer 31 are removed to form the conductive regions 32. The portions of the conductive layer 32 that are removed are those that are not within the gaps that were formed when the stack of layers was patterned. In one embodiment, portions of the conductive layer are removed by chemical mechanical polishing (CMP).

After forming the conductive regions 32, a dielectric layer 42, is formed over the entire workpiece, as shown in FIG. 5. The dielectric layer 42, as will be better understood after further discussion, may serve as an etch stop layer (ESL). The dielectric layer 42 may be an oxide (e.g., $SiO_2$), a nitride, or any other suitable dielectric. A first portion of the stack 15 and first portion of the dielectric layer 42 are removed from a peripheral region 44 while a second portion of the stack 15, the spacers 34, the gate insulating regions 36, the conductive regions 32, and a second portion of the dielectric layer 42 remain in the NVM region 30 Conventional photolithographic patterning and etching (e.g., wet or dry) may be used to remove the first portion of the stack 15 and the first portion of the dielectric layer 42. In the embodiment illustrated, an array boundary 40, to be discussed in more detail below, is formed between the NVM region 30 and the peripheral region 44.

The array boundary 40 formed between the NVM region 30 and the peripheral region 44 is a parasitic structure formed over an isolation region 14 that has no operation function. The array boundary is not required. However, if it is present it is useful to decrease defectivity. In the embodiment illustrated, the array boundary 40 includes the stack 15 and a spacer 34. The array boundary also includes the dielectric layer 42.

As shown in FIG. 6, after forming the dielectric layer 42, gate dielectric layers 53, 55, and 57 are formed in the peripheral region 44 and, afterwards, a layer 50 including silicon (e.g., polysilicon) is formed over the workpiece 10 in the NVM region 30, the array boundary 40, and the peripheral region 44. The three gate dielectric layers 53, 55, and 57 are formed in the peripheral area as part of a high voltage device region 52, an input/output (I/O) device region 54, and a low voltage device region 56, respectively. As a skilled artisan should recognize, the three device regions 52, 54, and 56 are only examples of devices in the peripheral region 44. Any combination (including none or all) of these devices may be present in the peripheral region 44; furthermore, other types of peripheral devices may be formed in the peripheral region 44.

To form the gate dielectric layer 53 in the high voltage device region 52, a dielectric material may be grown, deposited, or a combination of both over the entire peripheral area 44. Any suitable gate dielectric material may be used. In one embodiment, the gate dielectric layer 53 is a silicon dioxide that is approximately 150 Angstroms thick. In one embodiment, the gate dielectric layer 53 has an initial thickness less than approximately 150 Angstroms, but subsequent oxidations used to form the gate dielectric layers 55 and 57 (as described below) increases the thickness of the gate dielectric layer 53 to approximately 150 Angstroms. After forming the gate dielectric layer 53, a mask may be formed over the workpiece 10 to expose the I/O device region 54. A wet etch may be performed to remove in the I/O device region 54 the portion of the gate dielectric layer that was formed for the high voltage device region 52. After exposing the semiconductor substrate 12, the gate dielectric layer 55, which in one embodiment is a transistor gate oxide, may be grown, deposited, or both. In a preferred embodiment, the gate dielectric layer 55 is thermally grown oxide having a thickness between approximately 50 to 60 Angstroms. The mask is then removed and another mask may be formed over the workpiece 10 exposing the low voltage device region 56. A wet etch may be performed to remove the portion of the gate dielectric layer for the high voltage device region 52 that was previously formed in the low voltage device region 56. After exposing the semiconductor substrate 12, the gate dielectric layer 57 may be grown, deposited, or both. In a preferred embodiment, the gate dielectric layer 57 is thermally grown oxide having a thickness of approximately 22 Angstroms. A skilled artisan recognizes that all the dimensions discussed herein may vary based on the device technology used.

The layer 50 including silicon can be formed by any suitable process, such as CVD. In one embodiment, the layer 50 including silicon is approximately 1,000 to 1,500 Angstroms (in thickness) of polysilicon. After forming the layer 50 including silicon over the workpiece 10, a mask (not shown) is formed. The mask is patterned to form the gate electrodes in the peripheral region 44. A suitable anti-reflective coating (ARC) (not shown) formed over the layer 50 including silicon may be used to facilitate patterning of the gate electrodes in the peripheral regions 44. This anti-reflective coating may constitute silicon rich nitride, organic carbon ARC, the like, or combinations of the above.

Figure 7:
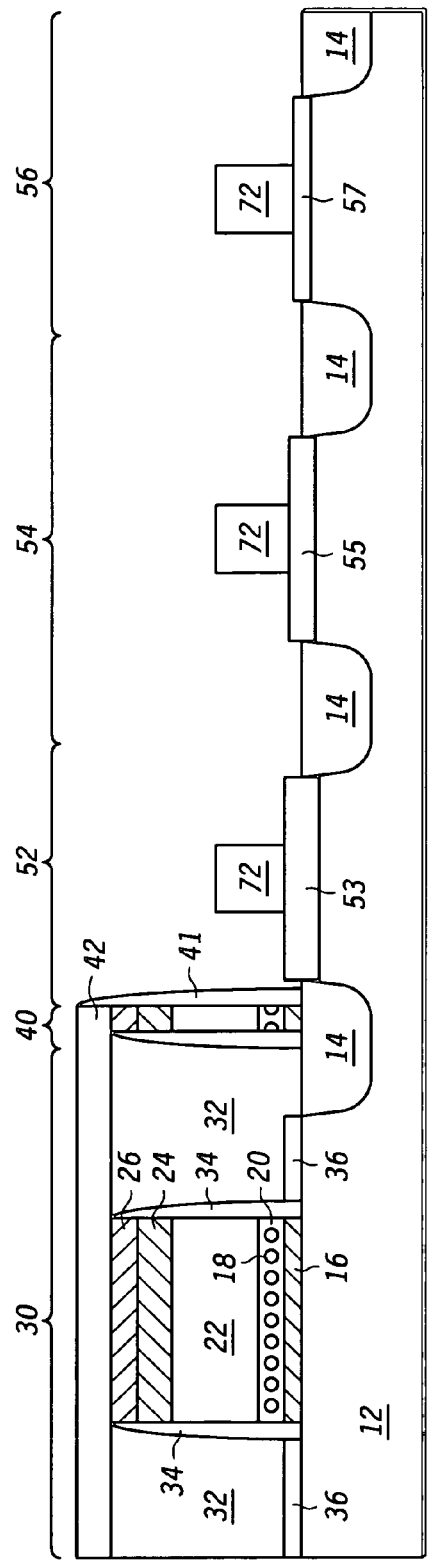

Using the mask, the layer 50 including silicon is etched to form the gate electrodes 72, as shown in FIG. 7. In addition, a spacer 41 is formed adjacent the array boundary 40. In one embodiment, the etch is an anisotropic etch chemistry including fluorine (e.g., a chemistry including $Cl_2$, HBr, and $CF_4$). Any portions of the layer 50 including silicon that is over the NVM portion 30 of the workpiece 10 is removed during the etching of the gate electrodes 72. The dielectric layer 42 serves as a etch stop layer (ESL) in the NVM region 44 during the etching. Thus, any suitable chemistry can be used that is selective to the material chosen for the dielectric layer 42.

As illustrated in FIG. 8 after forming the gate electrodes 72 in the peripheral region 44, the NVM area 30 is patterned to form the gate electrodes 62 and 61, which in the embodiment illustrated are select gates and control gates, respectively. Spacers 60 are formed adjacent the gate electrodes 72. While forming the spacers 60, spacers 70 are also formed adjacent the gate electrodes 72 in the peripheral region 44. Next, source/drain regions 71 are formed using conventional processing.

Figure 9:
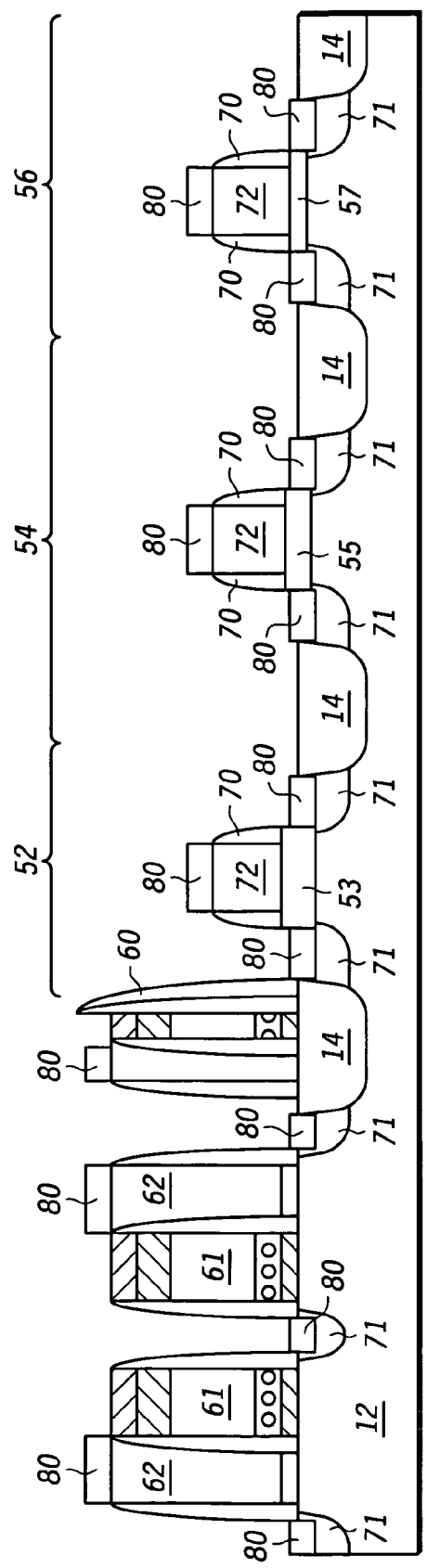

After forming the source and drain regions 71, the third dielectric layer 24 and exposed portions of the gate dielectric layers 53, 55, and 57 are removed, as shown in FIG. 9. In one embodiment, the third dielectric layer 24 and exposed portions of the gate dielectric layer 53, 55, and 57 are removed using a silicide pre-clean process, which includes an HF preclean and a non-reactive sputter etch. This silicide pre-clean process may be performed using conventional processes known to those skilled in the art.

Next, silicide may is formed over all exposed areas that include silicon, as shown in FIG. 9. Thus, the silicide 80 may be formed over the gate electrode 62, the source/drain regions 71, and the gate electrodes 72. In a preferred embodiment, to form the silicide 80 a layer of metal such as titanium, tungsten, cobalt, nickel, an alloy or other like material is blanket deposited. An anneal reacts the metal with any exposed silicon to form a silicide. Any unreacted metal is subsequently removed. A final anneal can then be performed.

Additional conventional processing may be used to continue forming an integrated circuit. For example, an inter-level dielectric layer, which may be oxide, can be formed over the workpiece 10 and interconnect layers can be formed. In addition, the workpiece 10 can be singulated and packaged using known techniques.

In one embodiment, a method for forming a semiconductor device includes providing a semiconductor substrate, forming a layer of nanoclusters overlying the semiconductor substrate wherein the layer includes a first portion and a second portion, forming a first gate electrode over the semiconductor substrate, wherein the first gate electrode includes silicon and the first portion of the layer of nanoclusters, removing the second portion of the layer of nanoclusters, forming a second gate electrode over the semiconductor substrate and adjacent the first gate electrode, wherein the second gate electrode includes silicon, forming a first silicon containing layer over the semiconductor substrate, and patterning at least a portion of the first silicon containing layer to form a peripheral electrode area. In one embodiment, forming the second gate electrode includes polishing the gate electrode material or the second gate electrode is further comprised of a polysilicon layer overlying a gate oxide layer. In one embodiment, the first gate electrode and the second gate electrode comprise a nonvolatile memory device. In one embodiment, the second gate electrode is devoid of nanoclusters. In one embodiment, forming a layer of nanoclusters overlying the semiconductor substrate further includes forming the layer of nanoclusters with densities between a range of $5 \times 10^{11}$ cm$^{-2}$ to $1.1 \times 10^{12}$ cm$^{-2}$, and forming the layer of nanoclusters with diameters between approximately 50-150 Å. In one embodiment, a first layer of dielectric is formed overlying the first gate electrode and the second gate electrode. In one embodiment, the first layer of dielectric is an oxide.

In one embodiment, a method for forming a semiconductor device includes providing a semiconductor substrate, forming a layer of nanoclusters overlying the semiconductor substrate wherein the layer includes a first portion and a second portion, forming a first gate electrode over the semiconductor substrate, wherein the first gate electrode includes silicon and the first portion of the layer of nanoclusters, removing the second portion of the layer of nanoclusters, forming a second gate electrode over the semiconductor substrate and adjacent the first gate electrode, wherein the second gate electrode includes silicon, forming a dielectric layer overlying the first gate electrode and the second gate electrode, forming a first silicon containing layer over the semiconductor substrate, and patterning at least a portion of the first silicon containing layer to form a peripheral electrode area. In one embodiment, the dielectric layer includes an oxide. In one embodiment, wherein patterning at least a portion of the first silicon containing layer to form the peripheral electrode area further includes forming a transistor gate oxide overlying the semiconductor substrate, and forming a high voltage transistor area overlying the transistor gate oxide. In one embodiment, the peripheral electrode area includes multiple thicknesses of the transistor gate oxide. In one embodiment, dielectric layer is deposited by chemical vapor deposition. In one embodiment, the peripheral electrode area further includes a low voltage transistor. In one embodiment, the peripheral electrode area further includes an input/output transistor.

In one embodiment, a method for forming a semiconductor device includes providing a semiconductor substrate, forming a layer of nanoclusters overlying the semiconductor substrate, forming a control gate overlying the layer of nanoclusters, removing a first portion of the layer of nanoclusters to form a first region devoid of nanoclusters, forming a select gate overlying the first region devoid of nanoclusters, removing a second portion of the layer of nanoclusters to form a second region devoid of nanoclusters, and forming a peripheral electrode area overlying the second region devoid of nanoclusters. In one embodiment, the layer of nanoclusters are silicon, silicon-germanium, aluminum, gold, or other types of conductive material or doped or undoped semi conductive material. In one embodiment, forming a layer of nanoclusters overlying the semiconductor substrate further includes forming the layer of nanoclusters with densities between a range of $5 \times 10^{11}$ cm$^{-2}$ to $1.1 \times 10^{12}$ cm$^{-2}$, and forming the layer of nanoclusters with diameters between approximately 50-150 Å. In one embodiment, the peripheral electrode area consists of a high voltage transistor area, an input/output transistor area, and a low voltage transistor area. In one embodiment, the select gate is silicided.

By now it should be appreciated that there has been provided a method for integrating (a) non-volatile memory device(s) with (a) peripheral device(s). Since fabricating nanocrystals can involve high temperatures for prolonged times, it is advantageous to form the low voltage wells after the nanocrystals have been fabricated, as has been described above. Although a control gate was formed first before forming the select gate, the select gate can be performed first. Various methods to form control gates first or select gates first are taught in a co-pending application, which is incorporated by reference, having the attorney docket number of MT10012TP entitled "Silicide Nonvolatile Memory and Method of Making Same" and filed on the same day herewith.

In the foregoing specification, the invention has been described with reference to specific embodiments. However, one of ordinary skill in the art appreciates that various modifications and changes can be made without departing from the scope of the present invention as set forth in the claims below. For example, a nitride, oxide, or polysilicon layer can be formed under the nanoclusters in the peripheral region and serve as an etch stop layer when the nanoclusters are removed. This is desirable if the nanoclusters are large (e.g., greater than 30 nanometers in diameter). Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an," as used herein, are defined as one or more than one. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. The term "plurality," as used herein, is defined as two or more than two. The term another, as used herein, is defined as at least a second or more.

What is claimed is:

1. A method for forming a semiconductor device, the method comprising:
   providing a semiconductor substrate;
   forming a layer of nanoclusters overlying the semiconductor substrate wherein the layer comprises a first portion and a second portion;
   forming a first gate electrode over the semiconductor substrate, wherein the first gate electrode comprises silicon and the first portion of the layer of nanoclusters;
   removing the second portion of the layer of nanoclusters;
   forming a second gate electrode over the semiconductor substrate and adjacent the first gate electrode, wherein the second gate electrode comprises silicon;
   forming a first silicon containing layer over the semiconductor substrate; and
   patterning at least a portion of the first silicon containing layer to form a peripheral electrode area.

2. The method of claim 1, wherein forming the second gate electrode comprises polishing the gate electrode material.

3. The method of claim 2, wherein the second gate electrode is further comprised of a polysilicon layer overlying a gate oxide layer.

4. The method of claim 1, wherein the first gate electrode and the second gate electrode comprise a nonvolatile memory device.

5. The method of claim 4, wherein the second gate electrode is devoid of nanoclusters.

6. The method of claim 4, wherein a first layer of dielectric is formed overlying the first gate electrode and the second gate electrode.

7. The method of claim 6, wherein the first layer of dielectric is an oxide.

8. The method of claim 1, wherein forming the layer of nanoclusters overlying the semiconductor substrate further comprises:
   forming the layer of nanoclusters with densities between a range of $5 \times 10^{11}$ cm$^{-2}$ to $1.1 \times 10^{12}$ cm$^{-2}$; and
   forming the layer of nanoclusters with diameters between approximately 50-150 Å.

9. A method for forming a semiconductor device, the method comprising:
   providing a semiconductor substrate;
   forming a layer of nanoclusters overlying the semiconductor substrate wherein the layer comprises a first portion and a second portion;
   forming a first gate electrode over the semiconductor substrate, wherein the first gate electrode comprises silicon and the first portion of the layer of nanoclusters;
   removing the second portion of the layer of nanoclusters;
   forming a second gate electrode over the semiconductor substrate and adjacent the first gate electrode, wherein the second gate electrode comprises silicon;
   forming a dielectric layer overlying the first gate electrode and the second gate electrode;
   forming a first silicon containing layer over the semiconductor substrate; and
   patterning at least a portion of the first silicon containing layer to form a peripheral electrode area.

10. The method of claim 9, wherein the dielectric layer comprises an oxide.

11. The method of claim 10, wherein the peripheral electrode area further comprises a low voltage transistor.

12. The method of claim 10, wherein the peripheral electrode area further comprises an input/output transistor.

13. The method of claim 9, wherein patterning at least a portion of the first silicon containing layer to form the peripheral electrode area further comprises:
   forming a transistor gate oxide overlying the semiconductor substrate; and
   forming a high voltage transistor area overlying the transistor gate oxide.

14. The method of claim 13, wherein the peripheral electrode area comprises multiple thicknesses of the transistor gate oxide.

15. The method of claim 9, wherein the dielectric layer is deposited by chemical vapor deposition.

16. A method for forming a semiconductor device, the method comprising:

providing a semiconductor substrate;

forming a layer of nanoclusters overlying the semiconductor substrate;

forming a control gate overlying the layer of nanoclusters;

removing a first portion of the layer of nanoclusters to form a first region devoid of nanoclusters;

forming a select gate overlying the first region devoid of nanoclusters;

removing a second portion of the layer of nanoclusters to form a second region devoid of nanoclusters; and forming a peripheral electrode area overlying the second region devoid of nanoclusters.

17. The method of claim 16, wherein the layer of nanoclusters are silicon, silicon-germanium, aluminum, gold, or other types of conductive material or doped or undoped semiconductive material.

18. The method of claim 16, wherein forming the layer of nanoclusters overlying the semiconductor substrate further comprises:

forming the layer of nanoclusters with densities between a range of $5 \times 10^{11}$ cm$^{-2}$ to $1.1 \times 10^{12}$ cm$^{-2}$; and forming the layer of nanoclusters with diameters between approximately 50-150 Å.

19. The method of claim 16, wherein the peripheral electrode area consists of a high voltage transistor area, an input/output transistor area, and a low voltage transistor area.

20. The method of claim 16, wherein the select gate is silicided.

* * * * *